May 1, 1951 W. R. KOCH 2,550,930

HIGH-FREQUENCY AMPLIFIER NEUTRALIZATION CIRCUITS

Filed Jan. 10, 1946

INVENTOR
WINFIELD R. KOCH
BY
H. S. Grover
ATTORNEY

UNITED STATES PATENT OFFICE 2,550,930

HIGH-FREQUENCY AMPLIFIER NEUTRALIZATION CIRCUITS

Winfield R. Koch, Haddonfield, N. J., assignor to Radio Corporation of America, a corporation of Delaware Application January 10, 1946, Serial No. 640,286

2 Claims. (Cl. 179—171)

My present invention relates to novel and improved circuits for neutralizing high frequency amplifier tubes of the screen grid type, and more particularly to circuits for providing more stable intermediate frequency (I. F.) amplification at higher signal frequencies.

While at relatively low radio frequencies amplifier tubes of the type using a screen grid have negligible regenerative feedback from the plate, or anode, to the signal input grid through the residual or inherent plate to input grid capacity, yet at higher radio frequencies appreciable regeneration takes place through the residual plate to input grid capacity. The magnitude of the regenerative feedback depends on various factors, such as the gain through the tube, the value of the residual capacity, the size of the tuning capacities and the signal frequency. Feedback through the residual plate to input grid capacity is increased where small capacities are used in the transformer tuned circuits, as may be done where compensation is included for changes in tube input capacity caused by changes in tube voltages.

AVC (automatic volume control) bias, negative in polarity, causes undesirable changes in input grid to cathode capacity (tube input capacity) thereby to affect the tuning of the amplifier. In the past it has been proposed to employ an unbypassed, or degenerative, cathode resistor in such an amplifier circuit thereby permitting the use of a smaller input capacity with resulting increase in the gain of each stage. However, the plate to input grid capacity then causes increased coupling from the plate to the grid circuit, with subsequent increase of regenerative feedback. The selectivity characteristic of the amplifier is altered and becomes unsymmetrical, and even varies with change in value of the AVC voltage. This presents an amplifier design problem, as, for example, in the case of I. F. amplifiers of frequency modulation (FM) receivers operating at 8 megacycles (mc.) per second.

In accordance with my present invention, I provide a simple and effective method of substantially reducing, if not eliminating, the undesirable capacity coupling between the input grid and output plate circuits by resonating in effect the undesirable capacity with an inserted inductive reactance at the operating signal frequency.

Another important object of my present invention is to provide a novel method of decoupling a source of high frequency energy from a load circuit, by in effect resonating a coupling capacity between the source and load to the frequency of the high frequency energy.

Another object of my present invention is to eliminate the effect of undesired plate to input grid capacity in an amplifier of the screen grid type by utilizing mutual inductance existing between the bypass capacitor leads on the ground side of bypass capacitors for series resonating the undesired capacity to the operating frequency of the amplifier.

A more specific object of my invention is to provide neutralization of undesired plate to input grid capacity of an amplifier tube over a wide band of signal frequencies.

Still other objects of my invention are to improve generally the stability of very high frequency amplifiers, and more especially to provide simple and effective neutralization for I. F. amplifiers operating in the megacycle range.

Still other features of my invention will best be understood by reference to the following description, taken in connection with the drawing, in which I have indicated diagrammatically several circuit organizations whereby my invention may be carried into effect.

Figure 1:
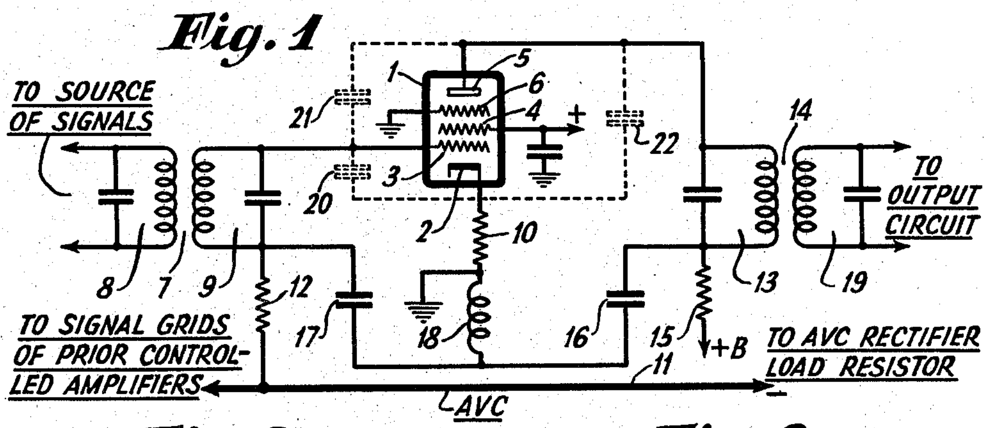
Fig. 1 is a schematic diagram of a circuit embodying an embodiment of the invention.

Referring now to the accompanying drawings, wherein like circuit elements are represented by similar reference numerals, the signal amplifier tube 1 is generally of the type embodying a positively charged screen grid electrode. The tube may be a tetrode, a pentode, or any other multigrid tube utilizing a screen grid. As shown in Fig. 1 the tube 1 comprises a cathode 2, a signal input electrode 3, a screen grid 4, a plate or anode 5, and a suppressor grid 6 located between screen grid 4 and plate 5. The signal input network may be coupled to any suitable signal source. By way of specific example for the purposes of the present application, it is assumed that the numeral 7 denotes an intermediate frequency (I. F.) input transformer whose primary circuit 8 and secondary circuit 9 are respectively tuned to a desired I. F. value. The primary circuit 8 may be coupled to the output electrodes of a prior I. F. amplifier tube, or it may be located in the plate circuit of a converter tube. In either case it is assumed that the tube 1 is utilized in a superheterodyne receiver system, a type of signal receiving system which is substantially universally employed today in radio communication.

The receiving system may be constructed either to receive amplitude modulated carrier waves, frequency modulated carrier waves or phase modulated carrier waves. The problem sought to be solved by the present invention arises in the radio frequency ranges substantially higher than the present amplitude modulation broadcast band of 550 to 1700 kilocycles (kc.) per second. For example, when operating the receiver IF in the megacycle (mc.) ranges the problem of plate to signal input grid feedback becomes appreciable regardless of the character of the modulation.

Although the invention is applicable to signals in an extended range of high frequencies, the circuit of Fig. 1 is intended for intermediate frequencies of the order of 8 megacycles per second. The cathode 2 of tube 1 is shown connected to ground by an unbypassed resistor 10. The signal input grid 3 is connected to the high alternating potential side of the resonant secondary circuit 9, while the low potential side of circuit 9 is returned to ground through the AVC line 11. Those skilled in the art of radio communication are fully aware of the construction of the AVC system, and will know that a filter resistor 12 connects the input circuit 9 to the AVC line 11 to suppress alternating current voltage components in the AVC voltage supplied from a suitable AVC rectifier. For the purposes of the present application it is believed sufficient to show the AVC line 11, and to indicate that it is connected to a source of negative direct current voltage which is derived from the load resistor of an AVC rectifier.

In general, the AVC rectifier consists of a diode, or any other suitable detector, supplied with amplified signals before they are demodulated. The rectifier load resistor which is connected to develop negative demodulated signals with respect to ground, the developed signals becoming increasingly negative with an increase of carrier amplitude above a predetermined carrier level. The AVC voltage is taken from a suitable portion of the load resistor and supplies the negative voltage to the signal grids of the various controlled signal amplifiers. It is accordingly indicated in Fig. 1 that AVC line 11 may be connected to the signal grids of prior controlled amplifiers, in addition to being connected to the signal grid 3 of tube 1. The function of the AVC system is to maintain a substantially uniform carrier level at the demodulator regardless of relatively wide amplitude variations at the signal collecting device of the receiver. This is accomplished by varying the effective negative voltage or bias of signal grid 3, as well as other controlled signal grids. It is to be understood that the AVC line 11 returns to ground through the load resistor of the AVC rectifier. The direct current voltage drop appearing across resistor 10 as explained below is therefore also applied in a negative polarity sense to the signal grid 3.

Plate 5 of amplifier tube 1 is connected to the high alternating potential side of the resonant primary circuit 13 of the I. F. output transformer 14. The low alternating potential side of circuit 13 is connected to the positive terminal (B+) of a suitable direct current energizing source through the resistor 15. The other terminal of this source as grounded and the low potential side of the circuit 13 is bypassed to ground by the I. F. bypass condenser 16. Similarly the I. F. bypass condenser 17 bypasses I. F. currents from the low potential side of input circuit 9 to ground. In accordance with my present invention the bypass condensers 16 and 17 are both connected in common to ground through an inductive element 18.

The secondary circuit 19 of the I. F. output transformer 14 may be connected to any suitable signal output circuit. For example, the output circuit may include a further I. F. amplifier, or it may consist of the demodulator of the receiving system. It is to be understood that each of circuits 13 and 19 is tuned to the operating I. F. value. Furthermore, for relatively narrow band reception, as in the case of amplitude modulation and frequency modulation reception, each of transformers 7 and 14 is arranged to be substantially band-pass in character. In order to preserve the band-pass selectivity of the selector circuits coupled to the input electrodes and output electrodes of tube 1, the cathode bias resistor 10 is kept free of capacitive bypassing.

The operation of the amplifier tubes depends upon the emission of electrons by the cathode 2 and their passage to and collection at the anode 5. This electron flow is controlled by the instantaneous voltage of the control grid 3 so that direct current from the B+ terminal to ground (the plate current) undergoes variations. These plate current variations develop across resistor 10, between cathode and ground, a small signal voltage in phase with the incoming signal voltages between the control grid 3 and ground. As the bias of the control grid is changed, the amplification of the tube changes and so does the measurable capacitance between this grid and the cathode, represented at 20. However as the tube gain is changed the signals across resistor 10 change in amplitude and if the resistance is suitably chosen, the signals carried capacitively from the control grid to the cathode can be made to remain substantially independent of the tendency of capacitance 20 to vary.

The effect is to prevent the AVC bias from affecting the selectivity of the input circuit 9. However, the very introduction of the unbypassed resistor 10 gives rise to a feedback problem by virtue of the fact that the effect of the plate to signal grid capacitance becomes more important.

This can be seen by considering the various other inherent inter-electrode capacities of tube 1. These undesired inter-electrode capacities 21, 22 are shown in dotted lines to indicate that the capacities exist inherently in the tube circuit and between the respective electrodes. Thus, the signal grid to cathode capacity is in shunt across the resonant input circuit 9, and affects the frequency of input circuit 9. By using the unbypassed resistor 10, the smaller effective changes in capacity 20 do not require the diluting action of large capacitances in input circuit 9 and enable operation with the improved gain of low capacitance inputs. However, because of the fact that the overall input capacity is made smaller, the coupling due to inherent capacity 21 between the plate 5 and signal grid 3 becomes effectively larger. In other words, there is provided an appreciable regenerative feedback path from the output circuit of tube 1 to its input circuit. The numeral 22 indicates the output capacity of the tube, or the inherent capacitance existing between plate 5 and cathode 2.

Depending upon the gain secured with tube 1, the frequency of operation, and the magnitude of the degenerative resistor 10, the regenerative feedback through capacitance 21 may be sufficient to cause the selectivity characteristic at I. F. input transformer 7 to become substantially unsymmetrical. Further, the shape of the characteristic will change with variation in magnitude of the AVC bias. Hence, it is seen that even though the amplifier tube employs a screen grid which, at lower radio frequencies, acts to reduce the capacitance 21 to an inappreciable value, yet at higher frequencies, by virtue of the desirable reduction of input capacitance 20 the undesired capacitance 21 assumes a sufficient magnitude to cause instability in the I. F. amplifier stage.

In accordance with my present invention the instability caused by the undesired capacitance coupling 21 is substantially eliminated by a simple and effective device. The inductive element 18 produces a substantial decoupling between the input and output circuits 9 and 13 respectively. This decoupling occurs by virtue of the fact that the inductive reactance of element 18 coacts with the capacitance reactance of the inherent capacitance 21 to produce the equivalent of a series resonant path common to the input and output circuits 9 and 13 respectively, the series resonance occurring at the signal frequency which in this case has been assumed to be 8 mc. By virtue of the effective common series resonance path there is substantially no coupling possible between the input circuit 9 and the output circuit 13. Hence, the feedback through the capacitance 21 is greatly reduced, if not eliminated.

Figure 2:
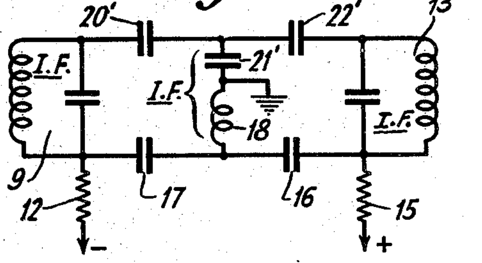
Fig. 2 is a simplified diagram explanatory of the circuit shown in Fig. 1.

In order to provide a clearer understanding of the operation of my invention I have depicted in Fig. 2 a simplified equivalent circuit diagram of the I. F. amplifier circuit shown in Fig. 1. It can be demonstrated that the tube capacities 20, 21, and 22 of tube 1 in Fig. 1 exist in the nature of a bridged T network as depicted in Fig. 2. For a detailed explanation of how the transformation is secured, reference is made to the book entitled "Transmission Circuits for Telephonic Communication" by K. S. Johnson, copyrighted 1927 by D. Van Nostrand Co., Inc., appendix D, page 282, Figs. 28A, 28B. In Fig. 2 only the input circuit and output circuit are shown, the high potential sides being connected through the series arranged capacities 20' and 22', while the low potential sides of circuits 9 and 13 are connected through the series arranged bypass condensers 17 and 16. The inductive element 18 is shown connected from the junction of condensers 17 and 16 to ground, while the capacitance 21' is connected from the junction of condenser 20' and 22' to ground. The capacitance 21' and inductance 18 in effect provide a series resonant path tuned to the operating I. F. value. This resonant path 21', 18 provides the means for decoupling the input circuit 9 and the output circuit 13. The ground connection at the upper end of coil 18 does not interfere with the decoupling effect of path 18, 21', because no other grounds exist on the output and input circuits. Accordingly, no radio frequency current will flow through the ground connection.

Substantially zero coupling exists between the circuits 9 and 13 of Fig. 2 due to the existence of the effective series resonant path 21', 18. The actual values of the equivalent network can be calculated from the information given in the Johnson publication cited above. On page 189, Fig. 5, sub-figure 8 and 5A, the transformation for the network, including the inductance, is shown. For the purposes of the present application it is sufficient to point out that inserting the inductive element 18 in the common path to ground from the junction of bypass condenser 17 and 16 will effectively prevent undesired coupling between the output circuit 13 and input circuit 9.

Figure 3:
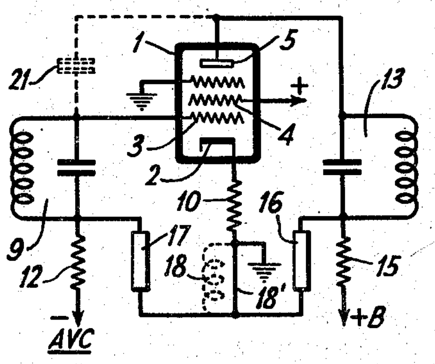
Fig. 3 is a schematic diagram of a modification of the circuit shown in Fig. 1.

In Fig. 3 I have shown a simple and economical scheme for providing inductive reactance 18. The magnitude of inductance required at 8 mc., for example, is about as much as that of a two inch length of wire. Thus, in Fig. 3 the bypass capacitors 17 and 16, shown symbolically as rectangles, have a common connection 18' to the grounded end of cathode resistor 10. The inductance 18 is shown dotted to indicate that it is the inductance provided by short lead 18'. The value of inductance 18 can then be adjusted by shortening or bending of the bypass capacitor leads if a close adjustment is desired, but, in general, the value of inductance 18 will not be very critical.

Figure 4:
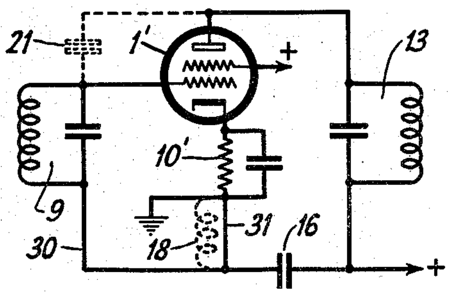
Fig. 4 is a schematic diagram of another modification of the circuit shown in Fig. 1.

In Fig. 4 tube 1' is a tetrode of the screen grid type. The cathode is shown connected to ground through a suitably bypassed bias resistor 10', and the low potential side of the input circuit 9 is connected directly to the grounded end of bias resistor 10'. It will be noted that the AVC circuit is dispensed with. In other words, the amplifier circuit shown in Fig. 4 does not utilize AVC, and the grid circuit is, therefore, returned directly to the ungrounded end of the inductance element 18. I have shown the inductive element 18 provided by the inductance of the short lead 31, and for this reason the inductive element 18 is represented by dotted line across lead 31. In this modification the inductive reactance of inductive element 18 will be chosen so that it series resonates the undesired capacitance 21' to the operating frequency of circuits 9 and 13 thereby substantially eliminating coupling between these latter two circuits.

Figure 5:
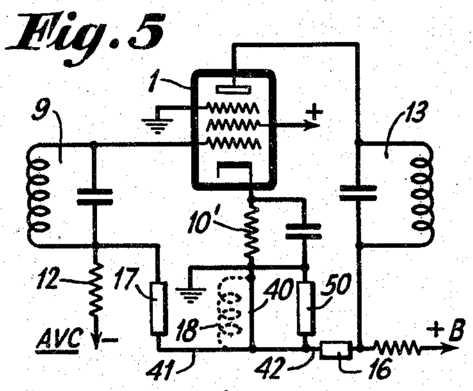
Fig. 5 is a schematic diagram of a further modification of the circuit shown in Fig. 1.

In the case of an amplifier adapted to have applied to its input circuit a wide band of high frequencies, as for example in the case of an amplifier of video modulated carrier waves, there may be employed a modification as shown in Fig. 5. In this modification the circuit elements are generally as shown in Fig. 3, except that a condenser 50 is shunted across the short lead 40 located between the grounded end of bypassed resistor 10' and the junction of the leads 41 and 42. The numerals 16, 17 and 50 designate schematic representations of condensers.

Figure 6:
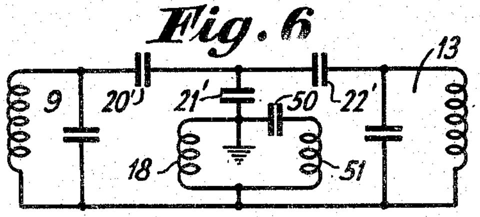
Fig. 6 is a simplified diagram explanatory of the circuit of Fig. 5.

In Fig. 6 I have shown the equivalent circuit diagram of the circuit of Fig. 5. It will be noted that the equivalent "T" network consisting of tube capacities 20', 21', and 22' include additional elements between the ground side of condenser 21' and the common low potential sides of circuits 9 and 13. This additional network consists of the inductive element 18 which is shunted by a series combination of condenser 50 and inductive element 51. This inductive element 51 is effectively provided by the inductance of the leads of capacitor 50.

Figure 7:
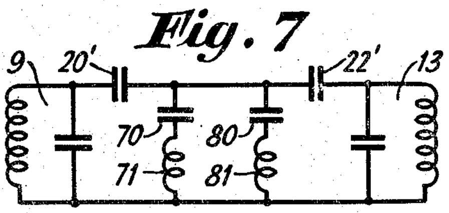
Fig. 7 is an equivalent circuit diagram of the circuit of Fig. 6.

In Fig. 7 I have shown the equivalent circuit diagram (transformation) for the circuit shown in Fig. 6 including the shunt network 18, 21', 50 and 51. It will be seen that the complex network is equivalent to a pair of series resonant circuits which are staggered in tuning. This transformation to the equivalent circuit of Fig. 7 is shown in the Johnson publication, Appendix D, Figs. 13C and 13D. Thus, the condenser 70 and coil 71 provide one series tuned circuit, while the condenser 80 and inductance 81 provide the second series tuned circuit. The resonant frequencies of these series tuned circuits are spaced so as to provide substantially zero coupling over the wide band of signals to be transmitted.

While I have indicated and described several systems for carrying my invention into effect, it will be apparent to one skilled in the art that my invention is by no means limited to the particular organizations shown and described, but that many modifications may be made without departing from the scope of my invention.

What I claim is:

1. In a high frequency signal amplifier of the type provided with an electron tube including at least a cathode, a signal input grid, an anode, and a positive screen grid between the signal grid and anode: a high frequency signal input circuit coupled to said signal input grid; a high frequency output circuit coupled to said plate; a resistor connected between the cathode and a point of fixed reference potential; an inductive element connected in a common circuit path between said common return conductor and the low potential sides of said input and output circuits; and a capacitor connected in shunt with said inductive element to provide substantial decoupling between the input and output circuits over a relatively wide band of signal frequencies notwithstanding the coupling between these circuits via the inherent capacitance between the input grid and the plate.

2. In a high frequency signal amplification system: an amplification stage including a cathode and a control grid; an input circuit and an output circuit, each having a high signal potential lead and a low signal potential lead; the high signal potential lead of the input circuit being connected to the control grid and the high signal potential lead of the output circuit being connected to the anode; a resistor connected between said cathode and ground, a first capacitor and a second capacitor being connected in series arrangement between the low signal potential leads of said input and output circuits, and an inductive element being connected between the junction of said capacitors and ground, and a capacitor connected in shunt with said inductance.

WINFIELD R. KOCH.

REFERENCES CITED

The following references are of record in the file of this patent:

UNITED STATES PATENTS

| Number | Name | Date |
|---|---|---|
| 2,082,767 | Koch | June 1, 1937 |
| 2,091,258 | Evans | Aug. 31, 1937 |
| 2,156,358 | Sinninger | May 2, 1939 |
| 2,170,645 | Peterson | Aug. 22, 1939 |
| 2,208,144 | West | July 16, 1940 |
| 2,226,074 | Root | Dec. 24, 1940 |
| 2,250,206 | Root | July 22, 1941 |
| 2,404,188 | Phillips | July 16, 1946 |
| 2,404,809 | O'Brien | July 30, 1946 |
| 2,444,864 | Van der Ziel et al. | July 6, 1948 |